United States Patent [19]

Trotel

[11] 4,095,112
[45] June 13, 1978

[54] DEVICE FOR AND A METHOD OF CALIBRATING ELECTRON-OPTICAL APPARATUS

[75] Inventor: Jacques Trotel, Paris, France

[73] Assignee: Thomson-CSF, Paris, France

[21] Appl. No.: 771,982

[22] Filed: Feb. 25, 1977

Related U.S. Application Data

[63] Continuation of Ser. No. 543,949, Jan. 24, 1975, abandoned.

[30] Foreign Application Priority Data

Jan. 25, 1974 France .................................. 74 02572

[51] Int. Cl.² ........................ G01N 21/00; G21G 5/00
[52] U.S. Cl. ................................. 250/492 A; 250/491
[58] Field of Search ........................... 250/492 A, 491

[56] References Cited

U.S. PATENT DOCUMENTS 3,857,041  12/1974  Spicer ............................. 250/492 A Primary Examiner—Alfred E. Smith
Assistant Examiner—T. N. Grigsby
Attorney, Agent, or Firm—Cushman, Darby & Cushman

[57] ABSTRACT

A device is provided for adjusting electron-optical apparatus. The specimen to be scanned is equipped with a marker emitting back-scattered electrons. A transducer, in response to these electrons, emits a signal which unblocks the modulating electrode of a cathode ray tube used for the display purpose. The tube screen has long persistance characteristics; the beam and the object holder being displaced in four mutually perpendicular directions by theoretically corresponding quantities, the adjusting errors are visible immediately.

4 Claims, 6 Drawing Figures

DEVICE FOR AND A METHOD OF CALIBRATING ELECTRON-OPTICAL APPARATUS

This is a continuation, of application Ser. No. 543,949 filed Jan. 24, 1975, now abandoned.

The present invention relates to a device for and a method of calibrating electron-optical apparatus.

The invention relates more particularly to electronic masking apparatus of the kind which, under the effect of signals generated by a data-processing system, are capable of tracing programmed patterns on a resin mask which is sensitive to electron bombardment. These kinds of apparatus are particularly useful for the manufacture of masks of small dimensions. Masks of this kind are used in particular in the technique of integrated circuits.

Generally speaking, the electron beam generated by an electron-optical system of suitable design, bombards the resin point by point and scans the sample holder carrying the resin, substantially as a television screen, that is to say line by line, and each line point by point. Each point has a size of the order of 0.3 microns and there are substantially 4000 points per line.

The problem arises, at the beginning of each scanning operation, of establishing whether a given deflection voltage applied to one of the scanning systems of the beam, corresponds with the requisite coordinates of the impact point, sufficiently accurately.

More precisely, the object of the invention is a device which, in association with this kind of apparatus, makes it possible to effect such an adjustment.

The device in accordance with the invention is characterised in that on the one hand, on the specimen, there is provided a marker capable of emitting back-scattered electrons, and a pick-up capable of detecting said electrons and in response producing an electric signal, said marker normally being situated at the point upon which the beam is incident for zero deflection voltage.

Devices are provided in order to displace the sample holder in each of the four perpendicular directions forming the two references axes, by a distance corresponding to the maximum deflection voltage in said direction, and in order to apply the voltage to the corresponding deflection system as well as to generate a correcting voltage which makes it possible to adjust the point of impact of the beam to coincide with said marker.

The invention will be better understood from a consideration of the ensuing description and by reference to the attached drawings in which:

FIG. 1 and FIG. 2 respectively illustrate a masking apparatus equipped with the device in accordance with the invention;

Figure 1:
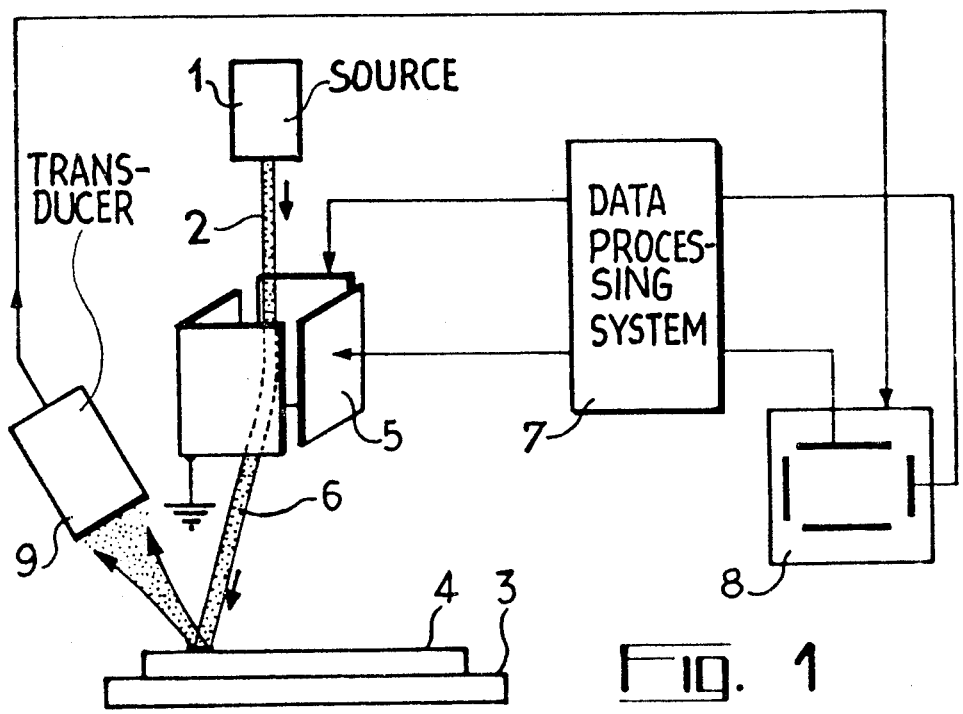

In FIG. 1, there can be seen an electronic masking apparatus comprising a cathode system 1 capable of emitting an electron beam 2.

A sample holder 3 carries the substrate 4 upon which the mask is to be formed.

Figure 2:
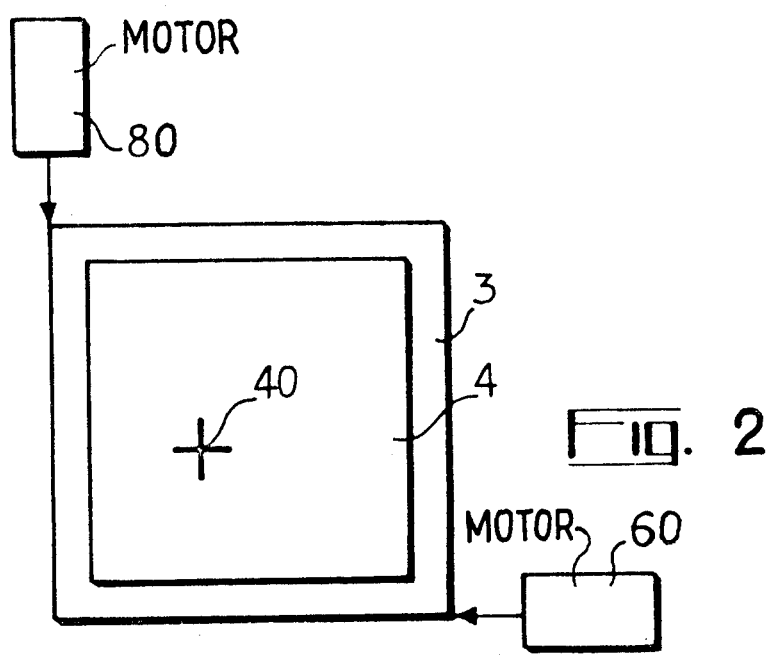

In FIG. 2, it can be seen that there is placed upon said substrate a marker 40 in the form of a cross, this for example taking the form of a gold deposit. The $x$ and $y$ deflection systems, 5 and 6, respectively for the beam, receive the control voltages from a data-processing system 7 which supplies proportional deflection voltages in parallel, to the deflection system associated with the screen 8 of a cathode ray tube. The deflection voltages being quantified, the beam is displaced point by point. A transducer 9 receives the electrons scattered back by the marker when the electron beam passes over the latter, and in response produces a signal which is applied to the control grid or modulating electrode of the cathode ray tube.

The displacements of the sample holder 3 are controlled, in a manner known in the art, by two motors 80 and 60 (FIG. 2).

Operation of the system is as follows:

In a first step, by controlling the motors which displace the sample holder, the substrate is brought into the position in which the marker is receiving the electron beam when the deflection voltages are zero. The beam is subjected to the programmed voltages in order to describe, line by line, a square 50 whose centre is the point corresponding to zero deflection. On the cathode ray tube screen (FIG. 3), the marker appears clearly. In order to suitably position the substrate in relation to the beam or vice versa, it is then merely necessary to bring the centre of the cross into line with the centre of the square.

The following steps are the calibration steps:

This involves the adjustment of the beam deflection system so that at given voltages applied to the deflection system, a given displacement of the point of impact of the beam on the substrate, is produced.

Figure 3:
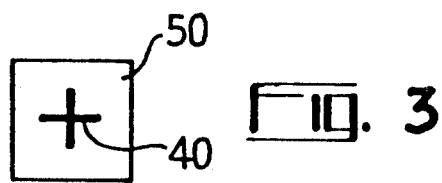
FIGS. 3, 4 and 6 are explanatory diagrams.

To achieve this result, in accordance with the invention, the sample holder is shifted successively in the two directions, $x$ and $y$, by measured distances $\pm$ X, $\pm$ Y, and the beam is simultaneously subjected to programmed voltages so that it describes the square shown in FIG. 3, however, using deflection voltages such that the centre of the square is shifted by the corresponding number of points.

FIG. 3 illustrates an example of four results obtained by adopting as non-limitative example the following data:

Mechanical displacement of the object holder in the four directions + or − X, + or − Y, by 600 microns by controlling the motors and adjustment of the deflection systems corresponding to a displacement of 2000 points, from the centre of the square scanned in these four directions, the system being arranged so that said 2000 points displacement corresponds effectively to 600 microns. If the apparatus has been properly adjusted, the square 40 will always have the centre of the cross as its centre.

Figure 4:
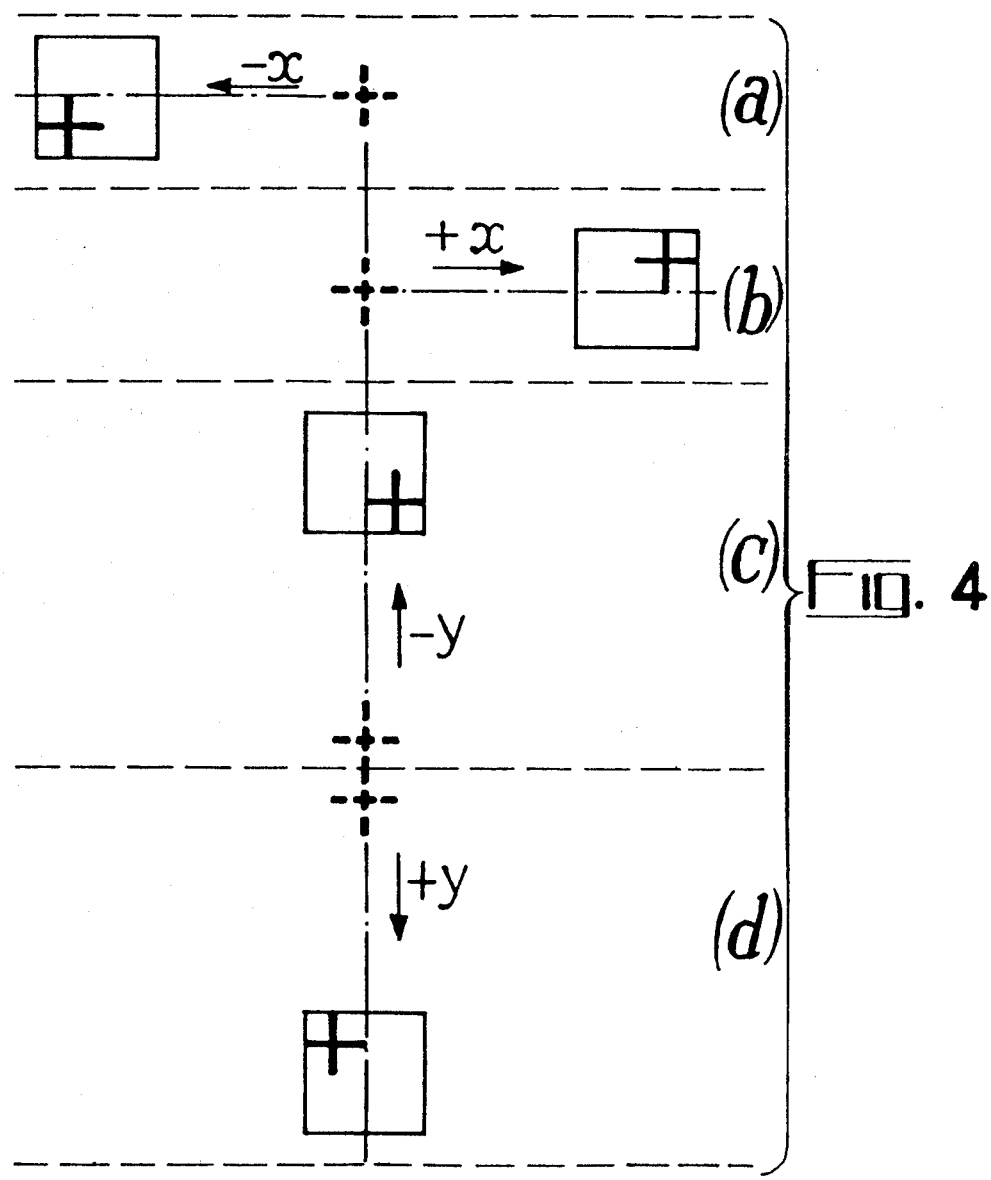

FIG. 4 illustrates the results obtained if adjustment is correct.

FIGS. 4a and 4b show respectively the results obtained when the adjustment is not correct.

FIG. 4a displacement has been effected along the X axis in the negative direction. The amplitude of the displacement, as in the following cases, is 600 microns. The beam has received a command to shift 2000 points along Ox, in the same direction. Similarly, in FIG. 4b, a displacement of 600 microns has been made in the positive direction along the X axis, and the beam has been supplied with a command to displace 2000 points, likewise in the positive direction. It will be seen from the figure, that the square 5 is no longer centred on the cross 4. The X deflection axis of the beam no longer coincides with the X axis of the sample holder. A first correction consists in rotating the direction of scanning along Ox, to bring the two axes together. A second correction makes it possible to effect recentring by adjustment of the amplitude of scan.

The same operations will be carried out subsequently in the directions + and − Y shown respectively in FIGS. 4c and 4d.

By successive adjustments of the voltages applied to the four deflection systems 4a, 4b, 4c, 4d, absolute centring and calibration of the scan amplitudes, are achieved.

In fact, the screen of the cathode ray tube, which may have a long persistence, simultaneously displays the four FIGS. 4a, 4b, 4c, 4d.

Figure 5:
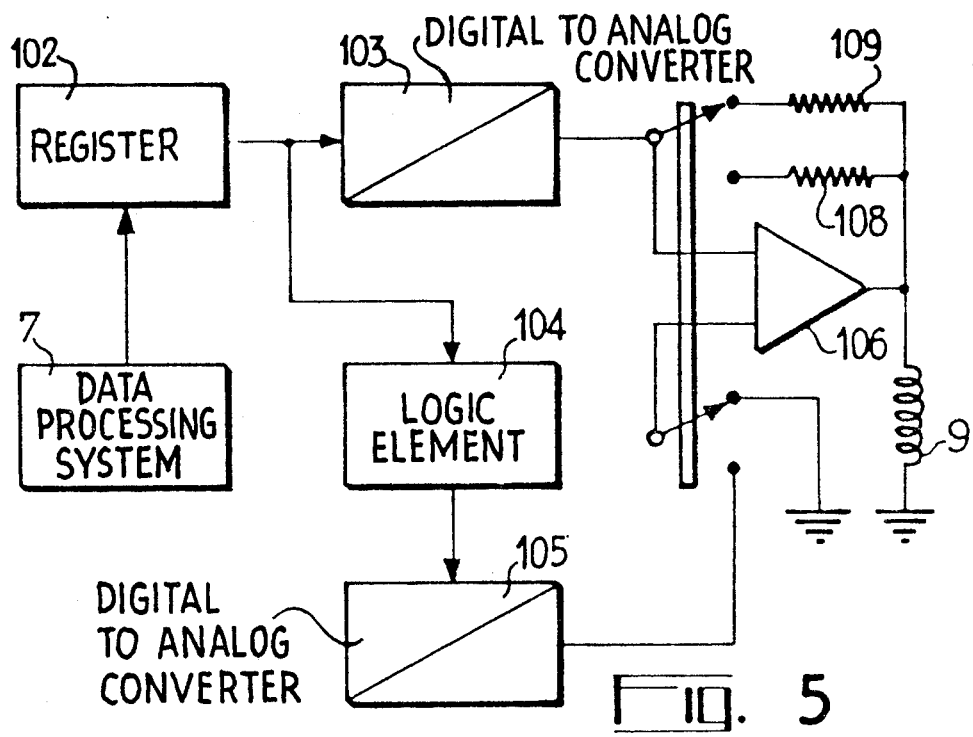
FIG. 5 illustrates a variant embodiment of the device in accordance with the invention.

Using this overall picture, it is possible simultaneously to adjust all the scanning voltages to achieve the desired setting. The adjustment can be further improved by means of the device shown in FIG. 5. This incorporates the computer 7 which acts upon a register 102, the latter, through a digital analogue converter 103, supplying to the deflection system 9 of the screen 8 of the cathode ray tube (said deflection system being symbolised by a coil), a deflection voltage corresponding to the number held in the register. This voltage is connected to the system 9 through a switch 107 and an operational amplifier 106; the switch has two inputs and four outputs. The first input is connected to the digital-analogue converter 103 and the two corresponding outputs are connected to the free terminals of two resistors 108 and 109, one of which has a much higher resistance than the other and both of which are designed to provide the amplifier 106 with negative feed back; one resistor having a resistance of R, the other will for example have a resistance of 10 R. The connection in series, of the resistor 108 or the resistor 109, by the switch 107, therefore has the effect of giving the amplifier 106 two gain values one of which (when the higher resistance resistor is placed in series) is ten times higher than the other.

The device 102 is connected on the other hand to a logic element 104, with three levels −1, 0, +1, itself connected to a digital-analogue converter 105 whose output, in response to the three levels −1, 0, +1, respectively furnishes three voltages −V, O, +V.

The switch 107 has a second input connected to the control input of the amplifier 106, and two second inputs connected respectively to earth and to the output of the digital-analogue converter 105. The switch 107 is manually controlled so that it can adopt two positions. In the first position (position I), the resistor 109 of low resistance is arranged in series and the amplifier has its control input earthed. In the second position (position II), the control input is connected to the output of the digital-analogue converter 105 and the resistor 108 having the highest resistance, is connected into circuit.

The operation of the system is as follows:

(A) The switch is in position I: the control input of the operational amplifier is earthed and the resistor 109 of low resistance is in the negative feed back circuit. The amplifier gain is low. By acting upon the oscilloscope deflection system, the screen displays the FIG. 4, as before.

(B) The switch is in position II: the amplifier gain is increased. The voltages applied to the deflection system are very much higher and the images may be outside the edges of the screen. The logic system, which is sensitive to the digits furnished by the register, adopts one of its three states −1, 0, and +1.

The converter circuit in response, produces:

(a) a voltage −V, if the digit held in the register is below a certain value −K. In this case, the amplified voltage will cause the image to expand outside the screen.

Figure 6:
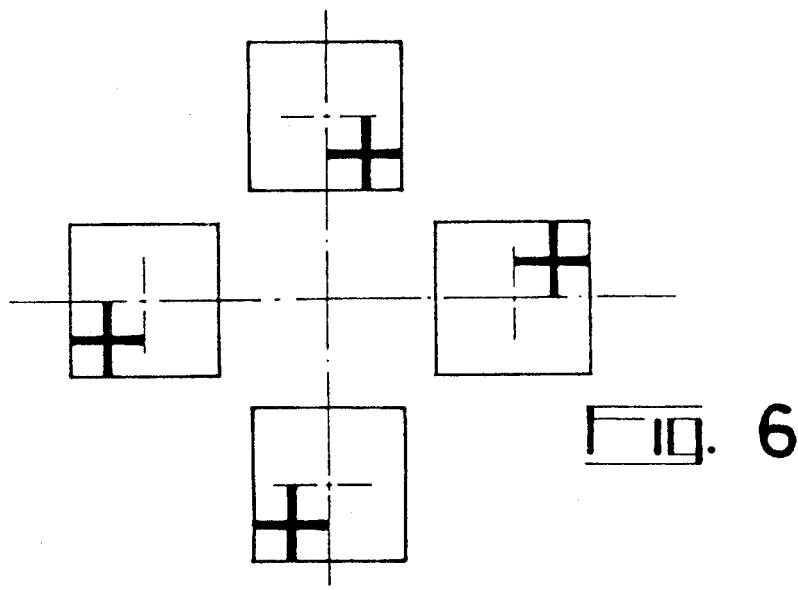

This voltage is subtracted from the voltage supplied by the operational amplifier and brings the image to within the screen limits;

(b) a voltage O, if the register digit is between +K and −K;

(c) a voltage +V, if the register digit is greater than the value +K. The voltage +V is then subtracted from the voltage supplied to the input of the operational amplifier, in common with the case (a). The image is then brought within the boundary of the screen. Then, the four amplified images are obtained as shown in FIG. 6.

What I claim is:

1. A calibrating method for an electron pattern generator, said generator having a sample holder, means for displacing said sample holder in two mutually perpendicular directions, a data processing system for sweeping said sample area by area, and each area line by line, and each line, point by point, said calibrating method comprising the following steps of:

manufacturing a marker upon said sample, at a given area bombarded by said beam at its rest position with a material capable of upon the impact of the electron beam, scattering electrons, and generating in response to this impact an electric signal;

transducing said signal into an image upon the screen of a cathode ray oscilloscope, by applying said signal upon the control electrode of said tube;

applying a programmed pattern simultaneously and synchronously to said oscilloscope and to said generator deflection system for displaying on said screen a predetermined figure centered about the image of said marker;

giving a predetermined mechanical displacement to said holder, and applying the voltage corresponding to said displacement to said deflection system of said pattern generator; and centering again said figure about said image of said marker.

2. A method as claimed in claim 1, wherein said pattern is a square.

3. A method as claimed in claim 2 wherein said mechanical displacement are made successively along both mutually perpendicular directions and in each direction, in both senses, the four displacements thus obtained having the same amplitude.

4. A method as claimed in claim 2, comprising the further step of simultaneously displaying the four figures upon said screen, this screen having persistent properties.

* * * * *